(12) United States Patent
Boswell et al.

(10) Patent No.: US 9,966,231 B2
(45) Date of Patent: May 8, 2018

(54) DIRECT CURRENT PULSING PLASMA SYSTEMS

(71) Applicant: Lam Research Corporation, Fremont, CA (US)

(72) Inventors: Roderick W. Boswell, Canberra (AU); Richard Alan Gottscho, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/368,486

(22) Filed: Dec. 2, 2016

(65) Prior Publication Data

US 2017/0250056 A1 Aug. 31, 2017

Related U.S. Application Data

(60) Provisional application No. 62/301,591, filed on Feb. 29, 2016.

(51) Int. Cl.
*H01J 7/24* (2006.01)
*H01J 37/32* (2006.01)
(Continued)

(52) U.S. Cl.
CPC .. *H01J 37/32091* (2013.01); *H01J 37/32174* (2013.01); *H01L 21/3065* (2013.01);
(Continued)

(58) Field of Classification Search
CPC ........... H01J 37/32082; H01J 37/32091; H01J 37/32146
(Continued)

(56) References Cited

U.S. PATENT DOCUMENTS

| 5,665,166 A | * | 9/1997 | Deguchi | ............. C23C 16/5096 118/723 E |
| 9,408,288 B2 | * | 8/2016 | Valcore, Jr. | ....... H01J 37/32165 |
| 2014/0197731 A1 | * | 7/2014 | Valcore, Jr. | ....... H01J 37/32935 315/111.21 |

OTHER PUBLICATIONS

Hu et al., "High Frequency Resonant SEPIC Converter with Wide Input and Output Voltage Ranges", IEEE Transactions on Power Electronics, vol. 27, No. 1, pp. 189-200, Jan. 2012.

(Continued)

*Primary Examiner* — Thuy Vinh Tran
(74) *Attorney, Agent, or Firm* — Martine Penilla Group, LLP

(57) ABSTRACT

A plasma processing system is provided that includes a chamber having a lower electrode coupled to a substrate support and an upper electrode coupled to ground. The plasma processing system having a plasma processing volume that is defined between the upper electrode and the lower electrode. A direct current (DC) to direct current (DC) converter is provided to receive at an input a DC voltage input and supply at an output an amplified DC voltage signal that includes a radio frequency (RF) component. The DC voltage input follows a pulsing pattern that is digitally programmable. The output of the DC to DC convertor is connected to the lower electrode of the chamber. A controller is interfaced with the DC to DC converter to set the pulsing pattern. In one example, the DC to DC converter uses one of a bipolar or non-bipolar DC voltage supply and a RF generator is driven by a DC voltage supply. The RF generator is configured to produce a frequency ripple that defines the RF component.

30 Claims, 7 Drawing Sheets

(51) Int. Cl.
*H02M 3/335* (2006.01)
*H02M 1/14* (2006.01)
*H01L 21/3065* (2006.01)

(52) U.S. Cl.
CPC ......... *H02M 1/14* (2013.01); *H02M 3/33507* (2013.01); *H01J 37/32082* (2013.01); *H01J 37/32146* (2013.01)

(58) Field of Classification Search
USPC .................................... 315/111.21, 348, 351
See application file for complete search history.

(56) References Cited

OTHER PUBLICATIONS

Unknown, "*EPC8010—Enhancement Mode Power Transistor*", Efficient Power Conversion Corp., pp. 1-2, Mar. 9, 2015.
Rooij et al., "Introducing a Family of eGaN FETs for Multi-Megahertz Hard Switching Applications", Efficient Power Conversion Corp., www.EPC-CO.com, pp. 1-7, © 2014.

* cited by examiner

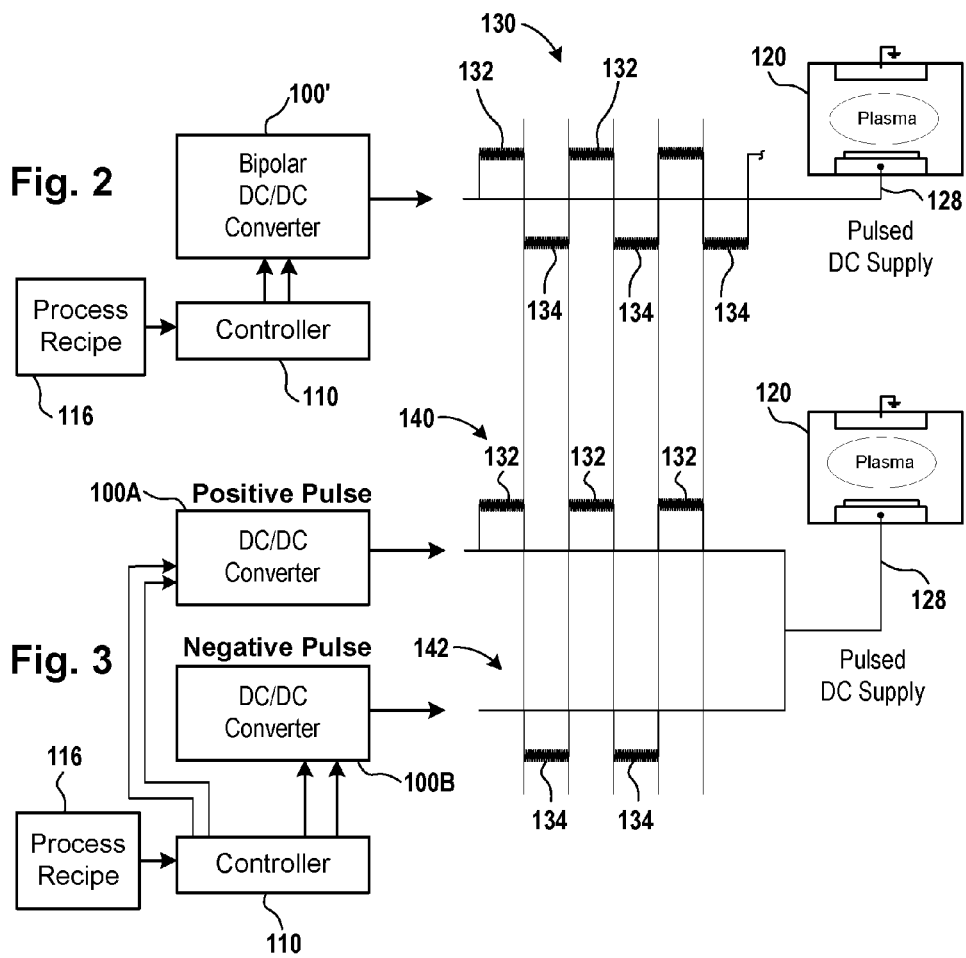

DIRECT CURRENT PULSING PLASMA SYSTEMS

CLAIM OF PRIORITY

This application claims priority from U.S. Provisional Patent Application No. 62/301,591 filed on Feb. 29, 2016, entitled, "Direct Current Pulsing Plasma Systems", of which is herein incorporated by reference.

BACKGROUND

1. Field of the Invention

The present embodiments relate to plasma processing systems, and in particular, to plasma processing systems that utilize direct current (DC) pulsing as the power source.

2. Description of the Related Art

Plasma has long been employed to process substrates (e.g., semiconductor wafers, flat panels, etc.) to form electronic products (e.g., integrated circuits, flat panel displays, etc.). Semiconductor wafers are typically placed in an etch chamber with a photoresist mask layer to selectively etch the underlying materials. The etching process removes the underlying materials (metals and/or dielectrics) not covered by the photoresist. The etching process, along with other processing operations, is repeated many times for each semiconductor wafer until the end product circuits or devices are formed.

Typically, a plasma etching tool is used to perform the etching process. A plasma etching tool is defined by a chamber that includes a substrate support and a plasma volume over the substrate support. Radio frequency (RF) power is commonly provided to one or more electrodes of the chamber. The electrode configuration can take on various forms, depending on the etch process. Commonly, plasma etching tools used to etch dielectric materials are referred to as capacitive coupled plasma (CCP) tools, and plasma etching tools used to etch conductive materials are referred to as inductive coupled plasma (ICP) tools. No matter the type of tool, both the CCP tools and ICP tools require at least one RF power supply. A RF power supply is typically configured to generate RF signals that are propagated to an electrode of the plasma etching tool via a match circuit and transmission line.

As the demand for higher aspect ratio etching and smaller sizes continues to increase, processing engineers have discovered certain benefits from pulsing the RF power supplied to the electrode of the plasma etching tool. Although pulsing of the RF power supply has shown improvement in the resulting process, pulsing RF power supplies does add complexity and cost. By way of example, pulsing RF power requires precise control of the pulsing sequence, timing, voltage levels, reflection, etc., and such control needs to be continually monitored. Additionally, supplying RF power via a match circuit and transmission line requires the implementation of significant hardware, e.g., such as large discrete capacitors and inductors, and sophisticated transmission lines that include a RF return path.

It is in this context that embodiments arise.

SUMMARY

Methods, devices, systems, and computer programs are presented for supplying power to a plasma processing system, where the positive and negative pulses can be independently controlled in voltage amplitude, polarity, rise and decay, width and delay, etc. In one implementation, a pulsed DC power system implements a power conversion system that takes a DC voltage, converts it to radio frequency and via a resonant circuit, amplifies it to high voltage then, via a network of diodes, and rectifies it back to DC. This system can be rapidly pulsed and does not have the impedance complications of the traditional radio frequency generators presently used to accelerate the ions. It should be appreciated that the present embodiments can be implemented in numerous ways, such as a method, an apparatus, a system, a device, or a computer program on a computer readable medium. Several embodiments are described below.

In one embodiment, a plasma processing system is provided that includes a chamber having a lower electrode coupled to a substrate support and an upper electrode coupled to ground. The plasma processing system having a plasma processing volume that is defined between the upper electrode and the lower electrode. A direct current (DC) to direct current (DC) converter is provided to receive at an input a DC voltage input and supply at an output an amplified DC voltage signal that includes a radio frequency (RF) component. The DC voltage input follows a pulsing pattern that is digitally programmable. The output of the DC to DC convertor is connected to the lower electrode of the chamber. A controller is interfaced with the DC to DC converter to set the pulsing pattern.

In some embodiments, the DC to DC converter includes a DC voltage supply, and a RF generator that is driven by the DC voltage supply. The RF generator produces a frequency of the RF component.

In some embodiments, the DC to DC converter includes a resonant circuit that is configured to multiply the DC input voltage, and a rectifier circuit that receives the multiplied DC input voltage and the RF component to produce the amplified DC voltage signal that includes the RF component.

In some embodiments, a ripple control is interfaced with the controller. The ripple control is configured to dynamically adjust the rectifier circuit to modify an amplitude of the frequency component.

In some embodiments, the dynamic adjustment of the rectifier circuit enables settings of higher or lower amplitudes during each active pulse of the pulsing pattern.

In some embodiments, the active pulse is one of a positive pulse of the amplified DC voltage signal or a negative pulse of the amplified DC voltage signal.

In some embodiments, the RF component is supplied to a positive pulse of the amplified DC voltage signal or a negative pulse of the amplified DC voltage signal, and wherein no RF component is supplied during an off pulse of the amplified DC voltage signal.

In some embodiments, the controller is coupled to a power control that provides the pulsing pattern, wherein the pulse pattern is digitally programmable to set one or more of voltage amplitude of the DC voltage input, a polarity of the DC voltage input, a rise and decay time of the DC voltage input, a width and delay of the DC voltage input, or combination of two or more thereof.

In some embodiments, a process recipe is configured to set a programming for the pulse pattern, and the programming is applied by the controller by digital programming to the DC to DC converter.

In some embodiments, the voltage supply and RF generator include field effect transistors (FETs) that are driven by a gate driver and supplied the DC voltage input.

In some embodiments, the resonant circuit is defined from resistive values, inductive values, and capacitive values, which define a quality factor Q, the quality factor Q providing an amplification for the amplified DC voltage signal.

In another embodiment, a method for processing a substrate using a capacitively coupled plasma (CCP) chamber driven by a DC to DC converter is disclosed. The method includes providing the chamber having a lower electrode coupled to a substrate support and an upper electrode coupled to ground. A plasma processing volume is defined between the upper electrode and the lower electrode. The method also includes providing a direct current (DC) voltage input based on a pulsing pattern, wherein the pulsing pattern is defined by a digital program. Then, generating a radio frequency (RF) component using the DC input voltage and amplifying the DC input voltage that includes the RF component. The method then rectifies the RF component to produce an amplified DC voltage signal that includes the RF component. The amplified DC voltage signal that includes the RF component is supplied to the lower electrode of the chamber. The pulsing pattern that is set by the digital program defines a frequency of the amplified DC voltage signal and a frequency of the RF component. The frequency of the amplified DC voltage defines positive or negative pulses, and pulse widths and amplitudes of the positive or negative pulses.

In some embodiments, the frequency of the DC voltage input is 400 KHz or less and the frequency of the RF component is selected from one of 2 MHz, 13.56 MHz, 27 MHz, 60 MHz, 80 MHz, and higher. The CCP chamber used for etching a material from a substrate when disposed on the substrate support of the chamber.

In some embodiments, the method also includes providing a ripple control to dynamically adjust an amplitude of the RF component during a positive pulse of the pulsing pattern.

In some embodiments, the dynamic adjustment of the amplitude occurs during one or more phases of the positive pulse of the pulsing pattern.

In some embodiments, digital program that defines the pulse pattern set one or more of voltage amplitude of the DC voltage input, a polarity of the DC voltage input, a rise and decay time of the DC voltage input, a width and delay of the DC voltage input, or combination of two or more thereof.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 illustrates an example of a process recipe being provided to the controller to produce a pulsing pattern, in accordance with one embodiment.

FIG. 3 illustrates an example where a process recipe is communicated to a controller, and separate DC to DC converters are used to supply independently positive and negative pulses, in accordance with one embodiment.

DETAILED DESCRIPTION

Figure 1A:
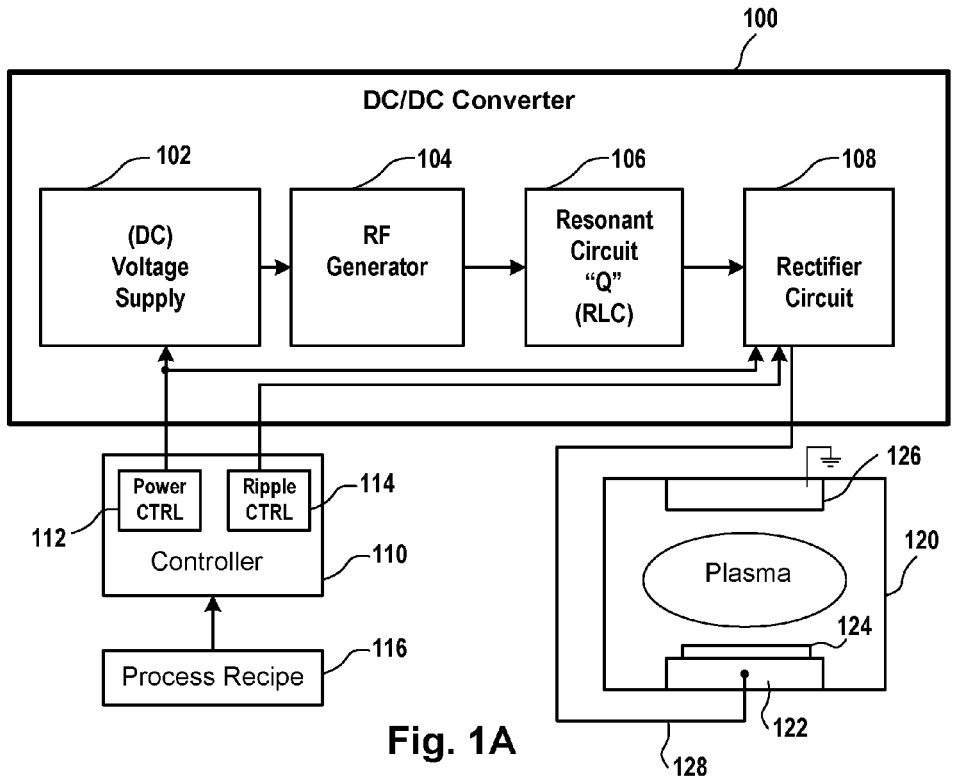
FIG. 1A illustrates an example of a DC to DC converter, utilized for providing pulsed RF power to a plasma chamber, in accordance with one embodiment.

The following embodiments describe methods, devices, systems, and computer programs for a DC/DC power converter for supplying pulsed power to an electrode of a plasma processing system.

In one embodiment, a method is disclosed where a high voltage from a DC power supply is applied to a plasm a processing system with the positive and negative pulses being independently controlled in voltage amplitude, polarity, rise and decay time, width and delay. The DC pulses are provided, as disclosed below, with a RF component ripple.

In processing plasmas, it is useful to have a controlled ion bombardment onto the substrate containing features being etched to ultimately define the microelectronic circuits being processed. This is pertinent to both the positive ions which are commonly used to sputter etch very small holes and to densify growing films and to the negative ions which can enter the holes being etched and neutralize the positive charge accumulation. As the plasma itself and the positive and negative ions contained therein have different timescale it is useful to control the amplitude of the voltages used to accelerate the ions, both for the duration of the process and within the process itself. Additionally, depending on the process, it is useful to control independently the time the voltage is applied as a pulse and the time delay until the next pulse. As the role of the positive and negative ions is different there is great advantage in the disclosed embodiments that enable control of the amplitudes, pulse width and delays of the positive and negative pulses independently.

Instead of using a repetitive form of generator, commonly denoted a radio frequency (RF) generator, a direct current to direct current (DC to DC) converter is used to enable pulse control of rise (and fall) times in the sub-microsecond range. The pulsed DC to DC converter, in one embodiment, includes a power conversion system that takes a DC voltage, converts it to radio frequency (RF) and via a resonant circuit, amplifies it to high voltage. Then, via a network of diodes, rectifies it back to DC. This system can be rapidly pulsed and does not have the impedance complications (e.g., which require complex matching networks) of a traditional RF generator presently used to accelerate ions.

In one embodiment, as the rise time of the DC voltage and the ripple associated with the diode network are related, a ripple control function is additionally provided. The ripple control function can be adjusted by a controller of the plasma processing system to increase or decrease an amplitude of the RF ripple during the up-version (i.e., positive ON cycle) of the DC pulse. In one embodiment, the RF ripple can be set by the RF generator of the DC to DC converter, which sets the frequency of the RF component. The frequency can be, for example, 2 MHz, 13.56 MHz, 27 MHz, 60 MHz, 80 MHz or higher, or some other useful frequency. In one embodiment, the DC pulse frequency is set to be less than about 1 MHz, and in particular embodiments, is set to be about 400 KHz. The lower frequency of the DC pulses provides the voltage required to draw the ions directionally toward the material being etched, while the high frequency of the RF frequency component acts to ionize plasma (e.g., creates plasma) in the processing volume of an etching chamber.

As noted above, because the RF ripple of the RF component can be controlled in amplitude by adjusting a setting of the rectifier circuit of the DC to DC converter, it is possible to add additional ionization to the plasma, thereby reducing the problem of matching networks. As discussed below, the ripple control provides a significant improvement to controlling the RF frequency component during each or select positive pulses. By way of example, ripple control can act to magnify the amplitude of the ripple at the beginning of a positive pulse to increase ionization of plasma. The ripple can, in some embodiments be shaped, to define different amplitudes at different phases of a positive pulse, which can be controlled and set based on a desired processing recipe.

It will be apparent, that the present embodiments may be practiced without some or all of these specific details. In other instances, well-known process operations have not been described in detail in order not to unnecessarily obscure the present embodiments.

FIG. 1A illustrates an example of a DC to DC converter 100, utilized for providing pulsed RF power to a plasma chamber 120, in accordance with one embodiment. As noted above, the DC to DC converter 100 is digitally controlled by controller 110, which enables the system to pulse rise and fall times in the sub-microsecond range. Additionally, depending on the process, the DC to DC converter 100 is capable of independent control of the time when the voltage is applied as a pulse, and also the delay time until the next pulse. The pulsing pattern that is produced can therefore be custom-designed with precision and enables rapid application and delivery to the electrode of the plasma chamber 120.

As described herein, the pulsing pattern can be programmed in numerous forms, shapes, and/or formats. By way of example, the pulsing pattern may be defined by a positive pulse that is followed by a negative pulse, and then repeated until power delivery is complete. In this example, the pulsing pattern may have a duty cycle of 50%. However, because the pulsing pattern can be rapidly controlled in a digital form, the pulsing pattern can have any configuration, which does not require positive and negative pulses that follow each other. As described below, some embodiments may be presented where the pulsing pattern is digitally programmed to only produce positive pulses, with off periods between the successive positive pulses.

In other embodiments, the positive pulse can be independently controlled from the negative pulse. By way of example, the programming can define a pulsing pattern that has a positive pulse followed by an off period, and then a negative pulse followed by an off period, and then repeat. As can be appreciated, the pulsing pattern can be dynamically controlled based on a process recipe, and is not fixed to the oscillation of a RF signal, as is the case in traditional RF generators. Additionally, the pulsing pattern can be programmed to produce pulses with specific voltage amplitudes, polarities, rise and decay times, width and delay, etc.

Returning to FIG. 1A, it is shown that the DC to DC converter 100 is coupled to the controller 110 that provides the digital programming for power control 112 and ripple control 114. In one embodiment, the power control 112 is configured to set the programming of the voltage supply 102 and other circuitry of the DC to DC converter 100. For example, the programming can control the rectifier circuit 108 to enable positive and negative rectification of the RF component. The voltage supply 102 is configured to provide the voltage that is supplied to drive RF generator 104. In one embodiment, the DC voltage supply 102 is configured to generate the pulsing pattern of the DC voltage component.

As noted above, this DC voltage component defines the desired pulsing pattern, as defined by the controller 110 and set by a process recipe 116. In one configuration, the pulsing pattern produced by the voltage supply 102 is configured to be less than 1 MHz. In other specific embodiments, the pulsing pattern produced by the voltage supply 102 is configured to be less than 400 kHz. In one embodiment, RF generator 104 produces a frequency that is predefined by the controller 110. The frequency setting can be, for example, 2 MHz, 13.56 MHz, 27 MHz, 60 MHz, or 80 MHz or higher.

A resonant circuit 106, defined by resistive components, inductive components, and capacitive components can be tuned to produce a desired quality factor (Q), which acts to multiply the voltage signal produced by the voltage supply 102. As shown, a rectifier circuit 108 is further provided as part of the DC to DC converter 100. The rectifier circuit 108 is configured from a plurality of diodes, e.g. a diode bridge and associated wiring, which is configured to rectify the RF signal produced by the RF generator 104. The results being output by the rectifier circuit 108 is an amplified DC voltage signal that includes a radio frequency (RF) component. In some embodiments, the voltage supply 102 may be a bipolar voltage supply.

The radio frequency component is a RF ripple that is a rectified version of the RF frequency provided by the RF generator 104 of the DC to DC converter 100. This signal is coupled via a conductive transmission line 128 to the lower electrode 122 of the plasma chamber 120. As shown, the plasma chamber 120 includes an upper electrode 126, which is grounded. This configuration is a simplified illustration of a capacitively coupled plasma (CCP) chamber, which is commonly used for etching processes. In an optimum configuration, the current and voltage of the pulsed DC supply would be matched to the impedance of the plasma to allow optimum power transfer. The same procedure would apply for the optimum transfer of the RF ripple on the DC pulse. In one embodiment, the CCP chamber can be used to etch a substrate 124, and material or layers of the substrate 124. By way of example, materials that may be etched in the CCP chamber may include dielectric materials.

As mentioned above, the processing plasma produced by powering the CCP chamber is useful to control ion bombardment onto the substrate containing microelectronic circuits being processed. This is pertinent to both the positive ions which are used to sputter etch very small holes and to densify growing films and to the negative ions which can enter the holes being etched and neutralize the positive charge accumulation. The plasma itself and the positive and negative ions contained therein have different timescale, so it is useful to control the amplitude of the voltages (i.e., the amplified DC voltage signal) used to accelerate the ions, both for the duration of the process and within the process itself.

The programmability further provides independent control of the time the voltage is applied as a pulse and the time delay until the next pulse (whether positive or negative). Further, as the role of the positive and negative ions is different there is great advantage in being able to control the amplitudes, pulse width and delays of the positive and negative pulses independently.

Figure 1B:
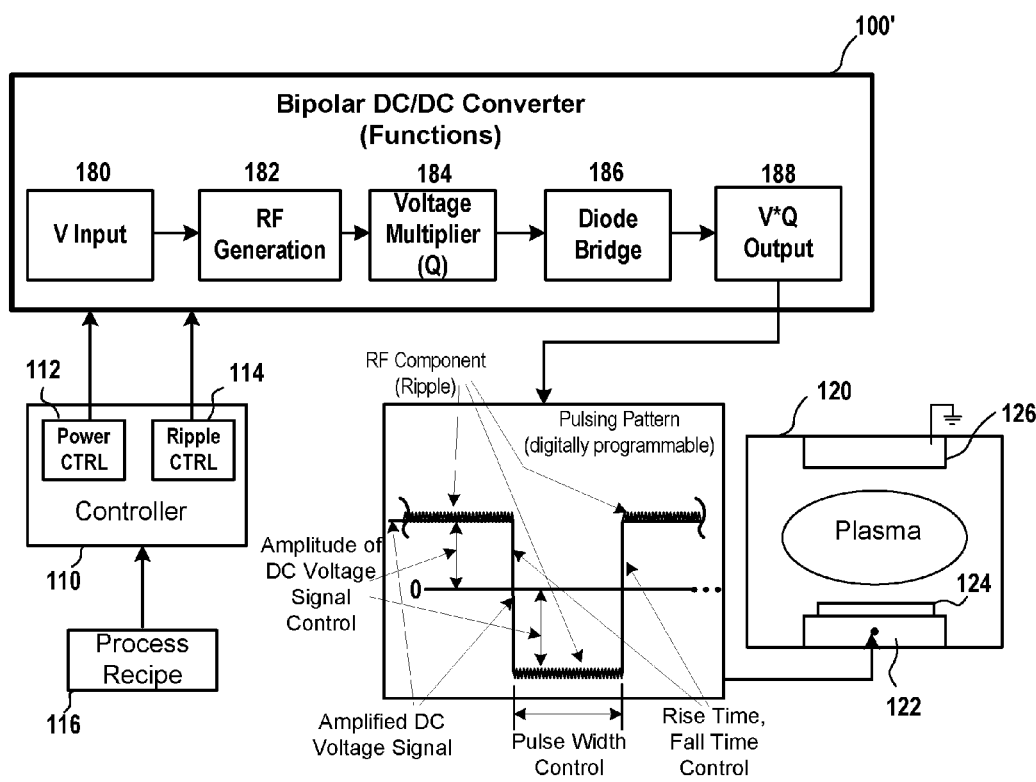
FIG. 1B illustrates an example of the functional operations performed by the bipolar DC to DC converter, in accordance with one embodiment.

FIG. 1B illustrates an example of the functional operations performed by a bipolar DC to DC converter 100', in accordance with one embodiment. In another embodiment, a non-bipolar DC to DC converter 100 may also be used to execute the functions. As shown, a voltage input 180 is provided by the power control 112, which is digitally controlled by the controller 110. As noted above, the settings, programming, pulsing pattern, and associated parameters for performing specific etch processes in the CCP plasma chamber 120 can be defined by a process recipe 116. The voltage input 180 is the voltage associated with the pulsing DC voltage described above. By way of example, if the process recipe 116 determines that the voltage input 180 should be 20V, the 20V can be set by the power control 112, in addition to the pulsing pattern and associated characteristics of the individual pulses of the pulsing pattern.

The voltage input 180 is provided to the RF generation 182, to drive the RF generator 104 that produces the RF frequency for the specific process recipe 116. As mentioned above, the RF frequency can be defined based on the process recipe. By way of example, the RF frequency may be 2 MHz, 13.56 MHz, 27 MHz, 60 MHz, 80 MHz, or higher. In some embodiments, the RF frequency may be specific frequencies between 2 MHz and 80 MHz, and need not be tied to the specific numeric megahertz frequencies that are commonly used. In some embodiments, the RF frequency may be slightly varied from the commonly used frequencies, e.g., to provide tuning.

The RF generation 182 then provides the RF signal to the voltage multiplier 184, which is configured to multiply the magnitude of the voltage input 180 by the quality factor Q. In one embodiment, and by way of example, if the quality factor Q is set to 100, the input voltage is multiplied by 100. Again, this multiplication value is only one example, and will depend on the process recipe 116 and the circuitry that is tuned to provide the voltage multiplication. A diode bridge 186 is used to rectify the RF component produced by the RF generator 104 in the RF generation 186. The diode bridge can be defined by a plurality of diodes that are interconnected to provide rectification for RF signals.

The specific configuration of the diode bridge can be tailored to provide different levels of rectification and control, as is known. The output 188 is therefore an amplified DC voltage signal that includes a RF component, which defines a RF ripple that is presented at the voltage magnitude defined by the multiplied voltage input and in accordance with the pulsing pattern. For illustration purposes, FIG. 1B shows a pulsing pattern that is digitally programmable, to define the shape, pulses, pulse widths, amplitude of the DC voltage signal, rise time and full-time controls, on and off times, etc. The amplified DC voltage signal therefore has a specific pulsing pattern that is defined by the power control 112, and set by the process recipe 116. The RF component, that defines the RF ripple, is provided at the voltage level defined by the amplified DC voltage signal.

The output of the DC to DC converter, being connected to the lower electrode of the plasma chamber 120, therefore receives the pulsed power, generated by the bipolar DC to DC converter 100' or by a non-bipolar DC to DC converter 100. As mentioned above, the digital control of the DC to DC converter enables precise control of the specific pulsing pattern that is to be delivered to the plasma chamber 120. In one embodiment, the plasma chamber is a CCP chamber, which is configured to etch materials, such as dielectric materials of a semiconductor wafer 124. As shown, the semiconductor wafer 124 may be placed on a substrate support that is coupled to the lower electrode 122.

Figure 1C:
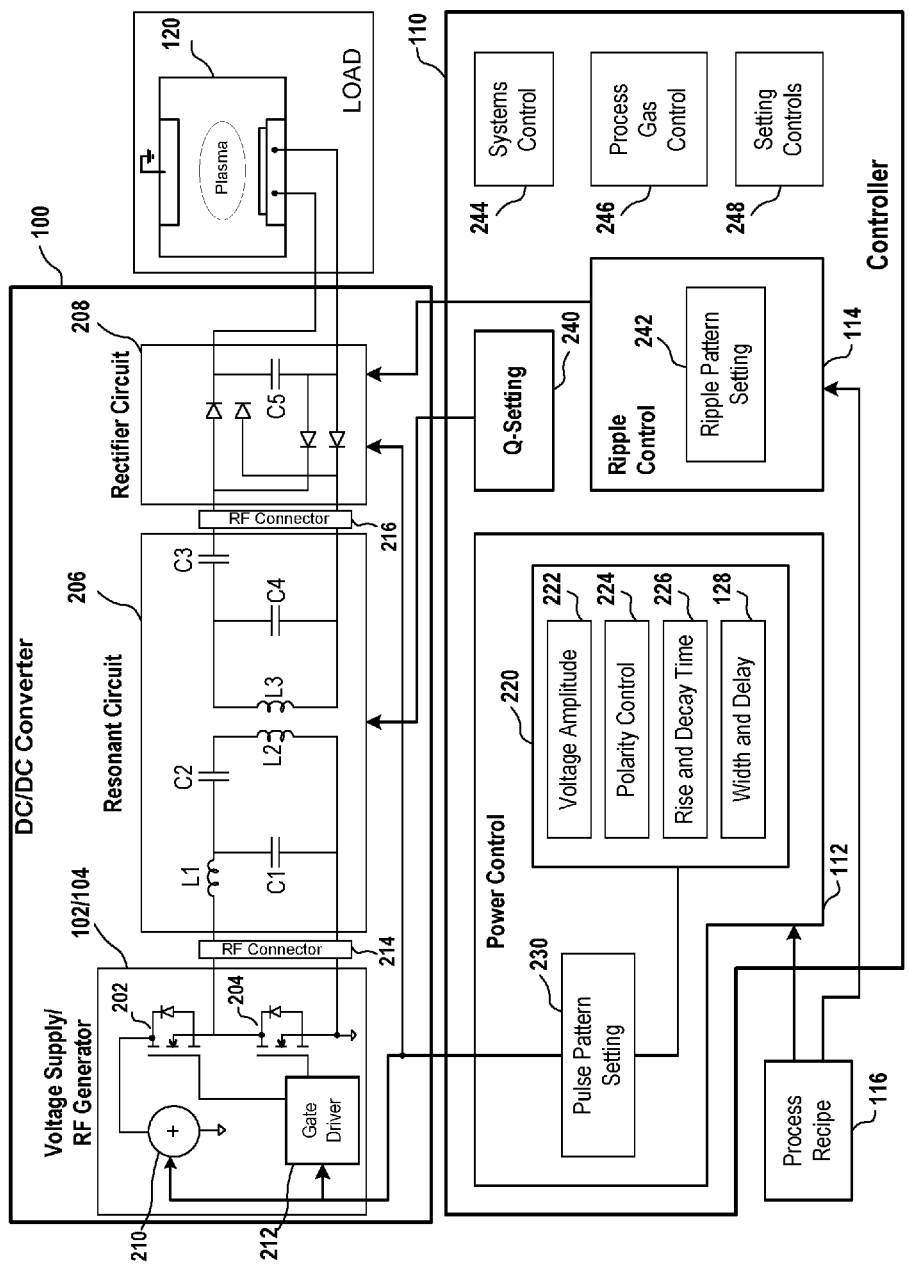
FIG. 1C illustrates one example configuration of a DC to DC converter, which may be used to power a load, such as the plasma chamber, in accordance with one embodiment.

FIG. 1C illustrates one example configuration of a DC to DC converter 100, which may be used to power a load, such as the plasma chamber 120. The circuitry provided herein is only by way of example, and it should be understood that different circuit components may be used to define the components of the DC to DC converter 100. With the foregoing in mind, the voltage supply and RF generator 102 and 104 may include field effect transistors (FETs) 202 and 204. These FETs may be driven by a gate driver 212 and a voltage supply 210. As shown, power control 112 can be used to control the voltage supply 210 and the gate driver 212. The output of the voltage supply a RF generator is therefore connected via a RF connector 214 to a resonant circuit 206.

The resonant circuit 206 is defined by a plurality of circuit components, such as inductors L1, L2, and L3, and capacitors such as C1, C2, and C3. Although not shown, the resonant circuit 206 may also include resistive elements, which can be adjusted along with the inductors and capacitors to define a desired quality factor "Q" setting. In one implementation, the inductors L2 and L3, may be defined by inductive coils. For instance, RF power between the left side of the resonant circuit and the right side of the resonant circuit can be coupled between inductive coils L2 and L3. In other embodiments, inductive coils are not used and the resonant circuit simply utilizes RLC components, to define the desired Q setting that multiplies the DC voltage input to produce the amplified DC voltage signal. The resonant circuit 206 is shown coupled to a rectifier circuit 208 by way of a RF connector 216. In one embodiment, the power control 112 is also configured to control operational parameters of the rectifier circuit 208, e.g., such as to define the positive or negative rectification of the RF component. The rectifier circuit includes a plurality of diodes, and a capacitor C5. This illustration of the rectifier circuit 208 is only one example of many types of rectifying arrangements that are commonly used as diode bridges. Rectifying circuits and diode bridges are well known, and therefore the rectifier circuit 208 is only shown by way of example.

In one embodiment, the power control 112 includes a pulse pattern setting control 230. The pulse pattern setting 230 is configured to define the pulsing pattern that is digitally conveyed to the DC to DC converter 100, and specifically to the power supply 102 and the rectifier 208, for example. Various control parameters 220 can be programmed for the pulsing pattern and can be set digitally via the controller 110. By way of example, these controls can include voltage amplitude 222, polarity control 224, rise and decay time 226, with and delay 128, and other parameters. These parameters enable the precision control of the resulting pulsing pattern that is communicated to the DC to DC converter 100. The process recipe 116, as noted above, is used to communicate the desired pulsing pattern for digitally programming the DC to DC converter 100, in order to optimally run the etching process in the process chamber 120.

As noted above, the Q setting 240 can also be set by the system controller 110, and is used to adjust RLC components of the resonant circuit 206, to achieve a desired quality factor Q. As mentioned above, the quality factor Q can be 100, or any other value that is desired for multiplying the voltage input provided by the voltage supply 102. Ripple control 114 is further controllable by the system controller 110, in order to set a ripple pattern setting 242. The ripple pattern setting 242 is communicated to the rectifier circuit 208, to enable adjustment of the RF component ripple that is provided with the pulsed DC voltage to the processing chamber 120.

As will be defined in more detail below, the ripple pattern setting 242 provides an additional control for adjusting the amplitude of the RF for ripple during positive pulses of the amplified DC voltage signal. For instance, it may be desired to increase the amplitude of the RF ripple in the RF component during an initial portion of a positive pulse, so as to increase ionization of plasma during the positive pulse. For instance, if a higher amplitude ripple is provided at the initiation of a positive DC pulse, of the pulsing pattern, it is believed that additional plasma ionization can be provided to improve the generation of positive ions used to sputter etch very small holes and features and densify growing films. During a negative pulse, it is possible to provide negative ions, which may enter the holes or features in order to neutralize any positive charge accumulation. Additional examples of ripple pattern settings 242 will be described in more detail below.

Although specific description is being provided regarding the digital control of the DC to DC converter, the controller 110 may also provide control for other facilities, systems, etc., for running a plasma chamber 120. By way of example, the controller 110 can provide instructions and control to enable system controls 244, process gas control 246, settings controls 248, and other functions or settings.

FIG. 2 illustrates an example of a process recipe 116 provided to the controller 110 to produce a pulsing pattern, in accordance with one embodiment. In this example, the controller 110 digitally programs a bipolar DC to DC converter 100' in order to produce a pulsing pattern that has a 50% duty cycle. By way of example, the pulsing pattern 130 includes positive pulses 132 and negative pulses 134. The pulsing pattern follows the DC voltage pulsing pattern defined by the process recipe 116, and executed by the controller 110 to digitally program the bipolar DC to DC converter 100'. As shown, the positive pulses 132 and the negative pulses 134 include a RF ripple, which is a RF component being supplied along with the amplified DC voltage. The pulsing pattern 130 is then provided to the lower electrode of the plasma chamber 130 by way of conductive communication line 128. As mentioned above, in an optimum configuration, the current and voltage of the pulsed DC supply would be matched to the impedance of the plasma to allow optimum power transfer. The same procedure would apply for the optimum transfer of the RF ripple on the DC pulse.

FIG. 3 illustrates an example where a process recipe 116 is communicated to a controller, and separate DC to DC converters are used to supply independently positive and negative pulses, in accordance with one embodiment. As shown, a positive pulse DC to DC converter 100A is used to generate the positive pulses 132 and produce a pulsing pattern 140. As shown, this provides for an off period in between each of the individual positive pulses 132. At the same time, the negative pulse DC to DC converter 100B is used to provide the negative pulses 134, at intervals where the off period of the positive pulses 132 reside. In this manner, synchronization can occur, as controlled by the controller 110 so as to provide pulsing pattern 140 and pulsing pattern 142 in synchronization, whereby two separate DC to DC converters are used to produce the pulsing pattern that could be produced using a bipolar DC to DC converter 100' or a non-bipolar DC to DC converter 100.

In some embodiments, dividing the positive pulse generation and negative pulse generation can simplify the DC to DC converter operation, and the controller 110 can be configured to control when pulses are generated by the positive or negative DC to DC converters 110A and 100B. The result being that the pulsed DC supply is provided by the conductive communication line 128 to the lower electrode of the plasma chamber 120.

Figure 4A:
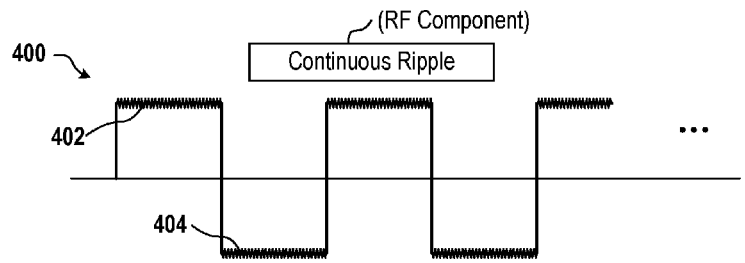
FIGS. 4A-4G illustrate several example pulsing patterns, without limitation, showing the flexibility of digitally providing pulses using the DC to DC converter, in accordance with several embodiments.

FIG. 4A illustrates an example of a pulsing pattern 400 that is approximately configured to provide a 50 percent duty cycle, in accordance with one embodiment. In this example, a continuous ripple 402 is provided during the positive pulses and a continuous ripple 404 is provided during the negative pulses. As mentioned above, the pulse width, pulse amplitude, rise time, fall time, and other parameters of the pulsing pattern can be controlled, and a digital form by the controller 110, in accordance with a process recipe 116.

Figure 4B:
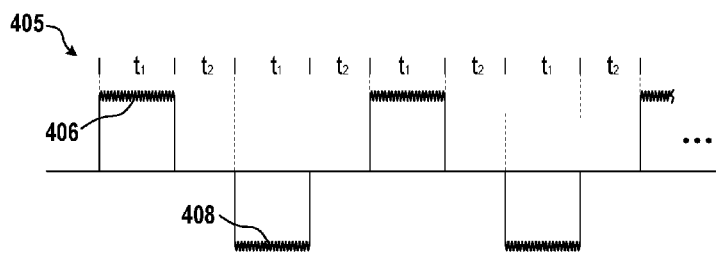

FIG. 4B illustrates an example of a pulsing pattern 405, where positive pulses 406 and negative pulses 408 can be programmed to occur at different times, in accordance with one embodiment. As shown, positive pulses and negative pulses can occur during a time period t1, and an off period can occur during a time period t2, which separate the positive pulses 406 and negative pulses 408. Again, the continuous RF ripple, which is the RF component, is provided during the positive pulses 406 and the negative pulses 408, as defined by the process recipe 116.

Figure 4C:
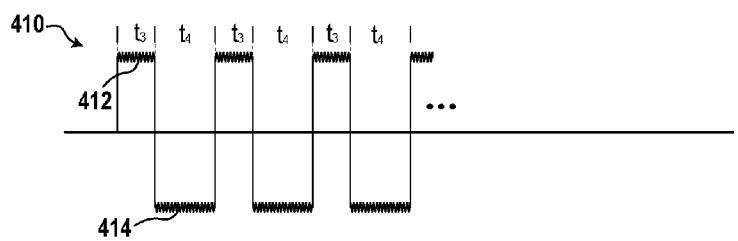

FIG. 4C illustrates a pulsing pattern 410, varying with positive and negative pulses, in accordance with one embodiment. As shown, positive pulses 412 will occur during a time period t3, whereas the negative pulses 414 will occur during a time period t4. In this example, time t3 is less than time t4, which provides for a longer negative pulse duration than positive pulse duration. Again, the programming defined by the process recipe 116 can define the duration of the positive and negative pulses. As such, it is possible that the time t3 can be made longer than the time t4, based on the processing needs.

Figure 4D:
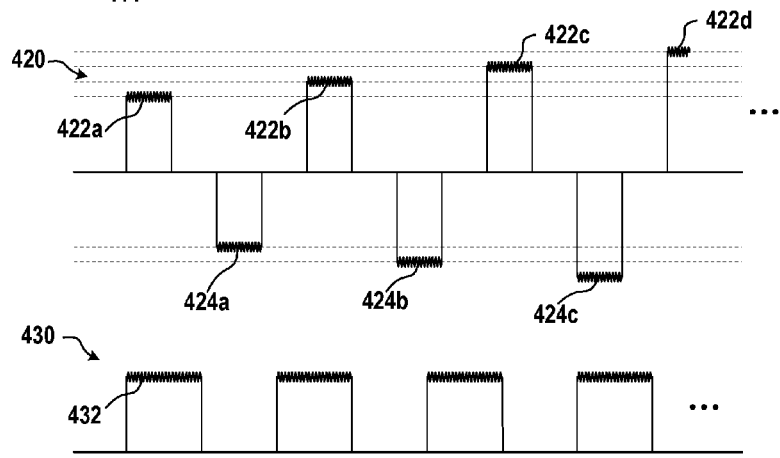

FIG. 4D illustrates another example of a pulsing pattern 420, in accordance with one embodiment. In this example, it is shown that the positive pulses 422a-422d, are provided with an escalated amplitude over time. The negative pulses 424a-424c, are provided with a corresponding escalated amplitude over time. It is possible that the amplitudes can escalate over time and then decrease over time, so as to define a cycling escalation or an increasing or decreasing ladder of pulses. For instance, it may be desired to increase the amplitude of the positive pulses during specific recipe steps or phases, and then decrease the amplitudes for other specific steps or phases. Again, the control provided by the DC to DC converter is precise and rapid digital control of the provided voltage pulses, along with the RF component ripple. This provides a flexibility not physically possible by a standard oscillating RF generator, which cannot provide rapid switching between positive and negative pulses, nor provide accurate amplitudes scaling on the fly in response to digital programming input provided by the controller 110.

Figure 4E:
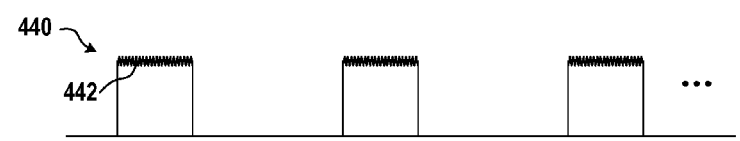
Figure 4F:
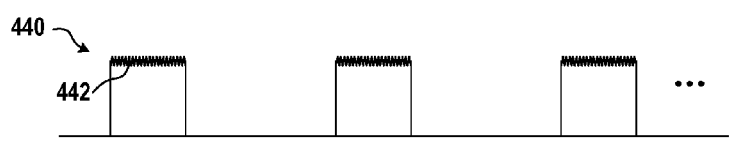

FIG. 4E illustrates another example of a pulsing pattern 430, in accordance with one embodiment. In this illustration, it is shown that the DC to DC converter can be programmed to simply provide positive pulses 432 at specific intervals. By way of example, each of the positive pulses is separated by an off period, which can be programmable. The pulse width of the positive pulses 432 can also be programmed to be larger or smaller. FIG. 4F illustrates an example where a pulsing pattern 440 is provided, which enables customized settings of the off period (e.g., delay) between the positive pulses 442.

Figure 4G:
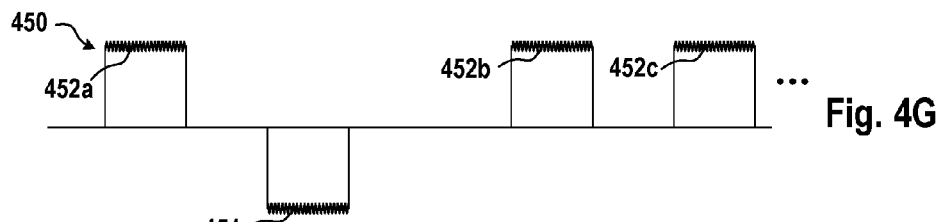

FIG. 4G illustrates an example of a pulsing pattern 450, where positive pulses 452a-452c can be provided at specific times, and coordinated with one or more negative pulses 454. This example is provided to illustrate that the system can digitally program a negative pulse or a positive pulse to occur, irrespective of the need to have continuous alternation between positive and negative pulses. These example pulse patterns have been provided to illustrate the flexibility of a DC to DC converter, and the rapid application of programmed pulsing for the delivery of power to a processing chamber 120.

Figure 5A:
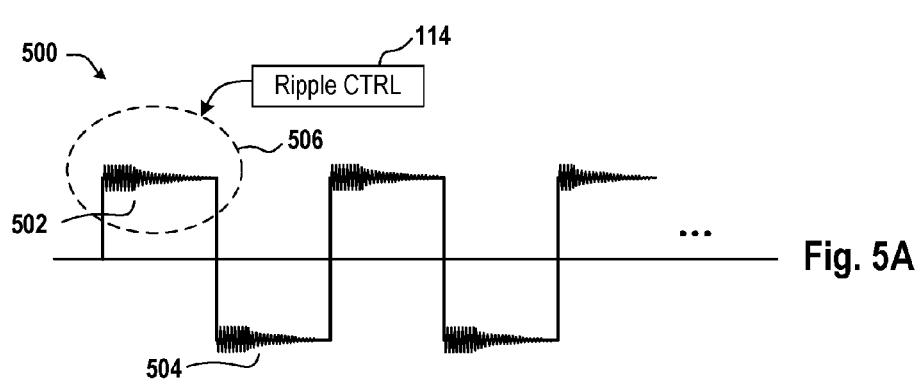
FIGS. 5A-5D illustrate examples of providing a ripple control to the pulses generated by the DC to DC converter, to provide additional ionization to the plasma at specific times, in accordance with a process recipe.
Figure 5B:
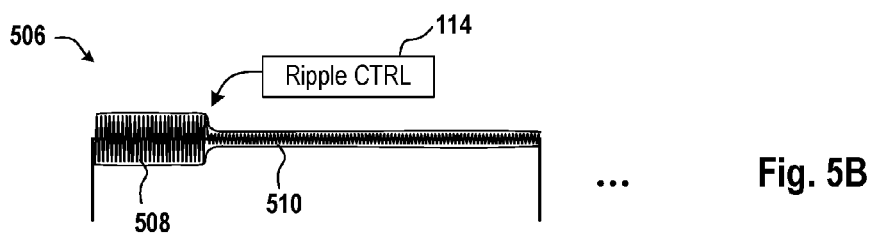

FIG. 5A illustrates an example of a pulsing pattern 500, which has been adjusted based on ripple control 114, in accordance with one embodiment. In this illustration, the positive pulses 502 are shown to include a higher amplitude ripple at the beginning of the pulse, which can be made to diminish as the pulse continues to be active. Similar control can be provided to the negative pulses 504. In some embodiments, only the positive pulses 502 are controlled by the ripple control 114, as the positive pulses are used to provide the positive ions needed to sputter etch very small holes or features and/or to densify growing films. Magnification 506 of the positive pulse 502 is shown in FIG. 5B. For example, the ripple control 114 can precisely provide an amplified ripple 508 near the beginning phase of the positive pulse 502. In this example, approximately the first 25 percent of the positive pulse 502 includes the amplified ripple of the RF component. It is possible that additional amplification can be provided for a longer period of time during the positive pulse, and can also be amplified for up to 100 percent of the positive pulse 502, as may be desired by the process recipe 116. As noted above, providing an increased amplitude ripple in the positive pulse portion can act to increase the ionization in the plasma. It is believed that increasing the amplitude of the ripple in the positive pulse will increase the ionization in the plasma volume, possibly near the upper electrode. In other configurations, providing an increased amplitude in the ripple during the negative pulses may act to increase ionization closer to the lower electrode, e.g., closer to the surface of the substrate. The choice of where to modify the ripple provides yet another control knob, which can be used to by process engineers to define precision controlled process recipes.

Figure 5C:
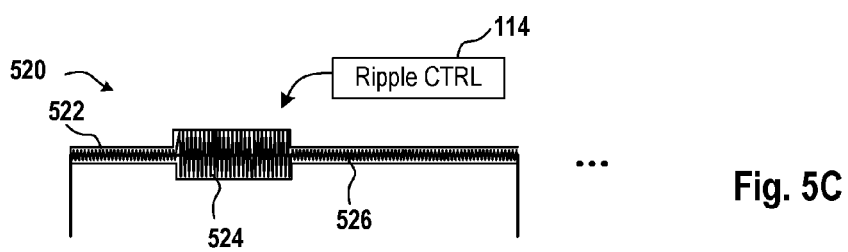
Figure 5D:
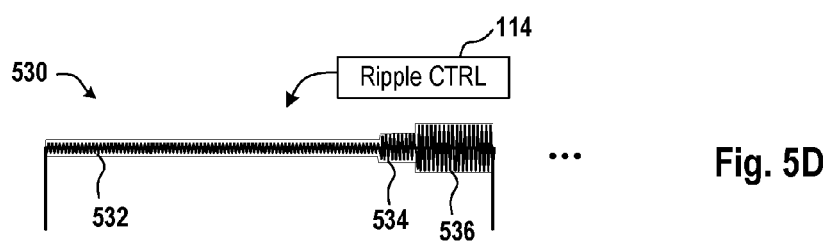

FIG. 5C illustrates an example where the ripple control 114 can be programmed to provide a normal ripple 522 followed by the amplified ripple 524 and then back to a normal ripple 526. In this illustration, it is shown that ripple control 114 can allow programmability of where in the positive pulse the ripple can be provided. FIG. 5D shows an example where a normal ripple 532 is provided at the beginning of the pulse, and toward the end of the pulse to different levels of amplified ripples 534 and 536 can be provided. Again, the process recipe 116 can define when and where ripple control can provide benefits to increase ionization of the plasma.

Figure 6A:
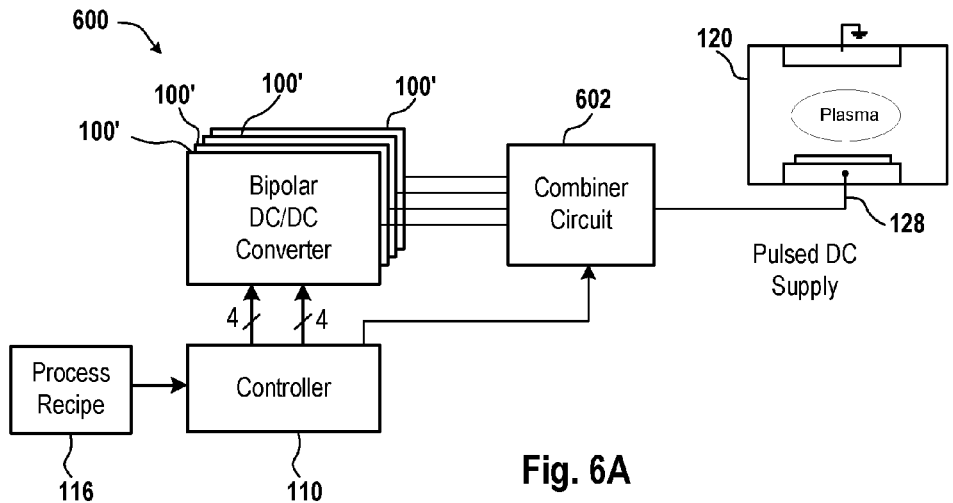
FIGS. 6A-6B illustrate examples of using multiple DC to DC converters (e.g. array of converters), to provide additional or increased power, when communicating power to a plasma processing system, in accordance with several embodiments.

FIG. 6A illustrates a system 600 where multiple bipolar DC to DC converters 100' may be used to provide additional power to the plasma chamber 120, in accordance with one embodiment. By way of example, bipolar and non-bipolar DC to DC converters can be made to provide different levels of power, depending on the efficiency of the circuitry, and the power capabilities of the field effect transistors (FETs). In some embodiments, the FETs can be high-frequency gallium nitride on silicon (eGaN). In some embodiments, these type of FETs are capable of high-speed switching. The switching can, in one embodiment, reach to 10 MHz or above. As further mentioned above, the pulsing rise (and fall) time may be controlled in the microsecond and sub-microsecond range. For additional information on eGaN FETs, reference may be made application note AN015, pp. 1-7, entitled "*Introducing a Family of eGaN FETs for Multi-Megahertz Hard Switching Applications,*" by Michael de Rooij, PhD, Johan Strydom, PhD, 2014, by Efficient Power Conversion Corporation, which is incorporated herein by reference for all purposes. These FETs are just an example, and other devices of different strength, construction and/or design can be used from other manufacturers, vendors, or suppliers.

In some implementations described herein, the switching speed is preferably set to be 1 MHz or below, and more preferably, at 400 KHz or below. Currently, these type of devices are capable of producing power in the neighborhood of about 2 Kilowatts (KW), e.g., 2 KV and 1 Amp. In some implementations, the amount of power needed to supply a CCP chamber, such as processing chamber 120, can be in the neighborhood of 8 KW to about 10 KW. In some embodiments, DC to DC converters may be engineered to produce much higher power, e.g., up to 50 KW and above. It is also possible to design DC to DC converters with higher power producing capacity, depending upon the target process chamber design and recipe requirements. For example, a DC to DC converter may be defined from an array of combined devices, so as to produce a higher summed power output. These embodiments may, for example, enable the combination of multiple DC to DC converters, each supplying 2 KW, 4 KW, 10 KW, etc., to be supplied via a combiner circuit 602. The power output can then be supplied to the lower electrode via a conductor 128 or to both the lower and upper electrodes, as described with reference to FIG. 7 below. The combiner circuit 602 can be configured to synchronize the frequencies provided by each of the DC to DC converters, which are also coupled to the controller 110.

In some embodiments, the combiner circuit 602 can act to adjust the phase between the outputs of the bipolar DC to DC converters 100, so as to provide a synchronized pulsing pattern with an amplified power output. In this example implementation, 8 KW of power is produced by combining four 2 KW bipolar DC to DC converters 100, so as to provide power to the plasma chamber 120 to perform CCP etching operations on materials formed on substrates. In some embodiments, as the power generation increases and capabilities improve in the circuitry of bipolar DC to DC converters 100, fewer bipolar DC to DC converters 100 may be used. Without limitation, because the bipolar DC to DC converters 100 are digital components, which are digitally programmable and controlled, an individual bipolar DC to DC converter 100 can be disposed on a printed circuit board (PCB), which may range in size of approximately 3 inches by 6 inches (e.g., a card or cards).

The size of the PCB can vary depending on the designed form factor, and the densification of the circuitry. For instance, the size of the PCB can be smaller or larger than the example size described above. Given the small form factor, combining multiple PCB cards of the multiple bipolar DC to DC converters 100' still provides a significant smaller size than traditional RF generators that typically occupy larger volumes. As a further advantage, the circuitry associated with the bipolar DC to DC converter 100 is significantly more efficient than traditional RF generators. By way of example, less heat is generated by the DC to DC converters than in typical RF generators, which reduces the need for complex cooling infrastructure, larger footprints, etc. The programmable nature of the DC to DC converter also provides a significant simplification and flexibility to defining the desired pulsing configurations, which are not possible when traditional RF generators are used.

Figure 6B:
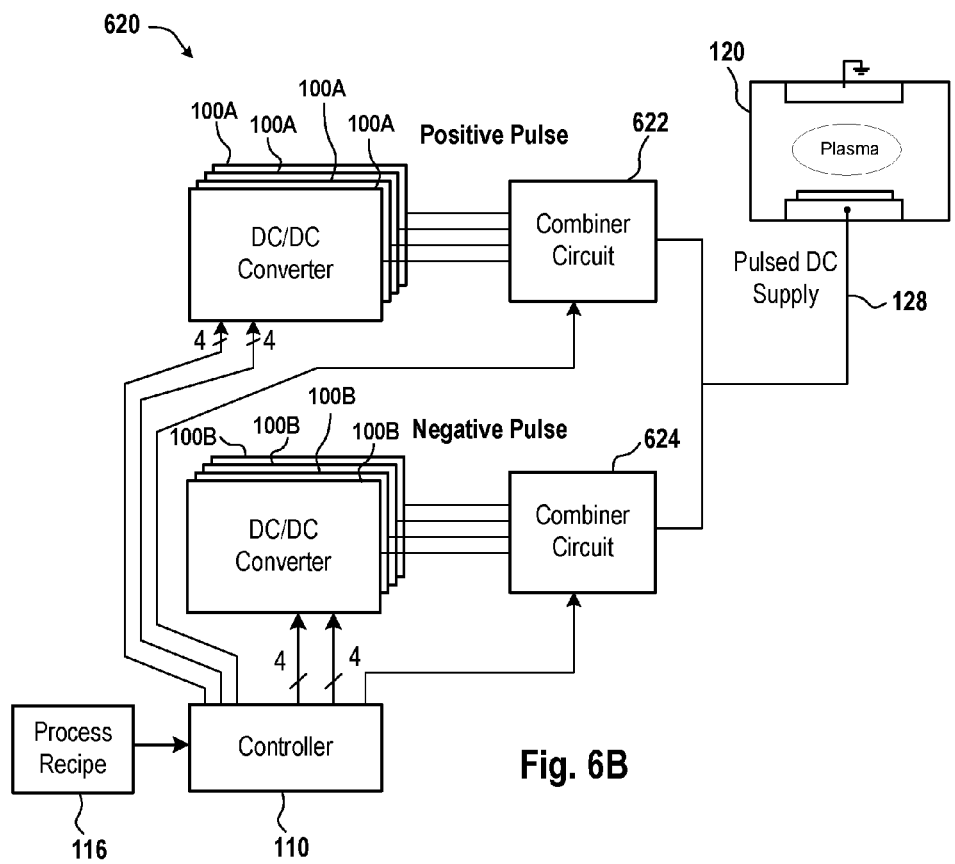

FIG. 6B illustrates another example of a system 620, where DC to DC converters 100A are used to provide positive pulses and DC to DC converters 100B are used to provide negative pulses. This example shows the combination of multiple DC to DC converters for each of the positive and negative pulses, in order to increase the generated power necessary for the supply positive and negative pulses. Combiner circuit's 622 and 624 are similarly used as combiner circuit 602. In some embodiments, it may be possible to supply the positive pulses with additional power, e.g. with more DC to DC converter cards than the number of DC to DC converter cards used for the negative pulses. The opposite can also be true. Again, the configuration of the system will depend on the process recipe 116, which controls how the controller 110 communicates with the DC to DC converters. As mentioned above, the controllers communicate power control 112 that define the pulsing pattern, and also the ripple control 114, which may be provided to adjust the amplitude of the ripple during a particular pulse, as described above.

Figure 7:
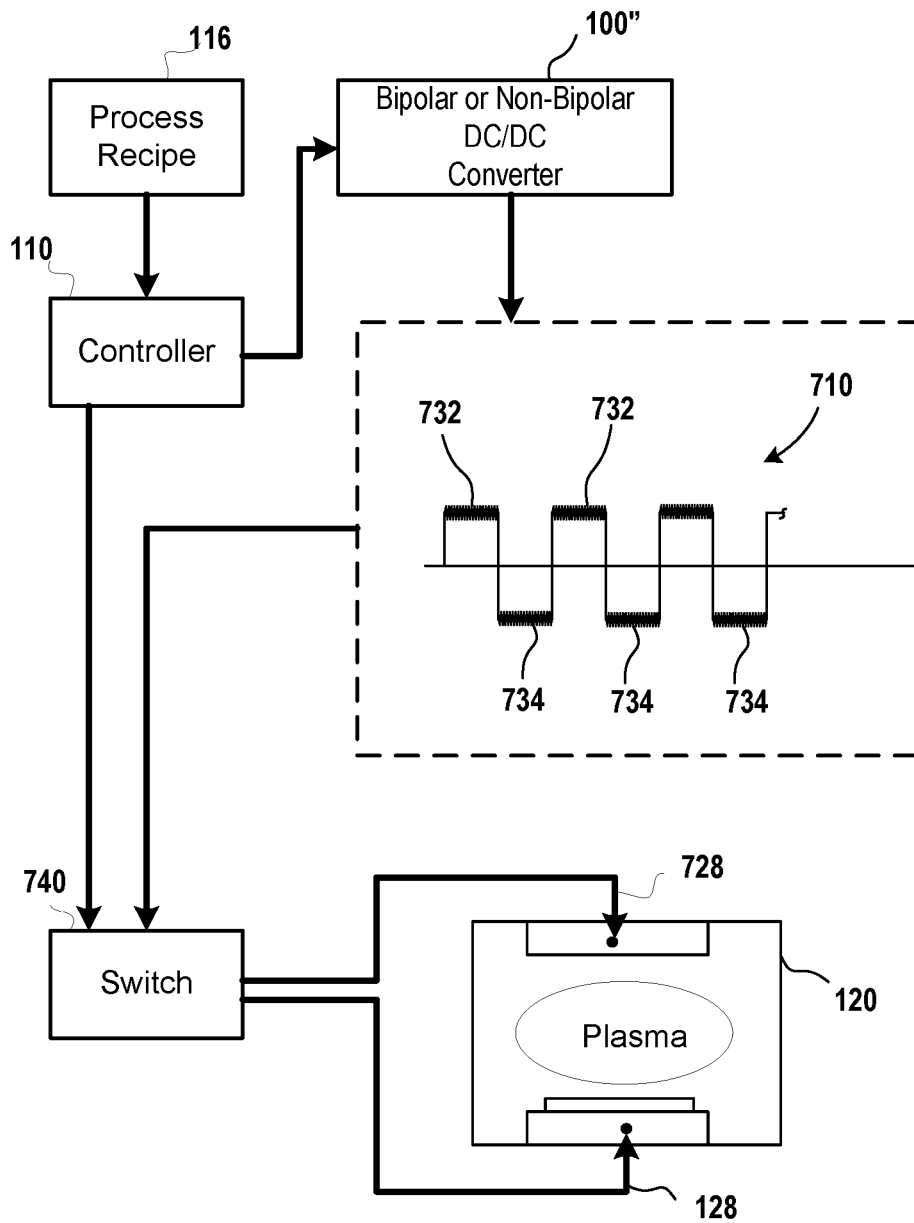
FIG. 7 illustrates another embodiment, wherein pulsed power can be provided to a process chamber to either the lower electrode or the upper electrode, or both, via a switch.

FIG. 7 illustrates another embodiment, wherein pulsed power can be provided to a process chamber 120 to either the lower electrode, the upper electrode or both. In some configurations, it possible to provide all pulsed power to the lower electrode via a switch 740, and the upper electrode is similarly connected to ground via the switch 740. The controller 110 is configured to program the switch 740, so as to control which electrode (i.e., upper and/or lower) receive power. In some configurations, the positive pulses 732 of pulsing pattern 710 can be provided to the lower electrode via transmission line 128, as set by the switch 740 and controller 110, while the upper electrode is grounded. During the negative pulses 734, the pulsed power can be diverted to the upper electrode via transmission line 728 while the lower electrode is grounded. In still other embodiments, it is possible for the switch 740 to provide an amount of power from each pulse (positive and negative) to both the upper and lower electrodes. The proportions of power delivered to either upper and lower electrodes therefore by dynamically controlled, as necessary to improve process efficiencies.

The switch 740 is therefore a programmable switch that can output power to either the upper electrode and/or the lower electrode via transmission lines 128 and 728. In one embodiment, the switch 740 can include electrical components and/or mechanical components. The switch 740 can, in some devices, have internal connections to ground, so as to enable connections of either the upper or lower electrode to ground. The switch 740, can thus cause either the upper or lower electrodes to be grounded, depending on the pulse (positive or negative), cycle, or process step, and/or monitored etch conditions.

Broadly speaking, the pulsed DC generation comprises a power conversion system that takes a DC voltage, converts it to radio frequency and via a resonant circuit, amplifies it to high voltage then, via a network of diodes, and rectifies it back to DC. This system can be rapidly pulsed and does not have the impedance complications of the traditional radio frequency generator presently used to accelerate the ions.

Information regarding implementations that utilize converters with varying voltage ranges, reference can be made to a paper entitled "*High-Frequency Resonant SEPIC Converter With A Wide Input And Output Voltage Ranges,*" by Jingying Hu, et al., published by IEEE Transactions On Power Electronics, Vol. 27, No. 1, pp. 189-200, January 2012, which is herein incorporated by reference for all purposes.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller 110," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma processing system, comprising,
    a chamber having a lower electrode coupled to a substrate support and an upper electrode coupled to ground, a plasma processing volume is defined between the upper electrode and the lower electrode;
    a direct current (DC) to direct current (DC) converter configured to receive at an input a DC voltage input and supply at an output an amplified DC voltage signal that includes a radio frequency (RF) component, the DC voltage input follows a pulsing pattern that is digitally programmable, the output of the DC to DC converter is connected to the lower electrode of the chamber; and
    a controller being interfaced with the DC to DC converter to set the pulsing pattern.

2. The plasma processing system of claim 1, wherein the DC to DC converter includes,
    a DC voltage supply, and
    a RF generator that is driven by a bipolar DC voltage supply, the RF generator producing a frequency of the RF component.

3. The plasma processing system of claim 2, wherein the DC to DC converter includes,
    a resonant circuit that is configured to multiply the DC input voltage; and
    a rectifier circuit that receives the multiplied DC input voltage and the RF component to produce the amplified DC voltage signal that includes the RF component.

4. The plasma processing system of claim 3, further comprising,
    a ripple control being interfaced with the controller, the ripple control configured to dynamically adjust the rectifier circuit to modify an amplitude of the frequency component.

5. The plasma processing system of claim 4, wherein the dynamic adjustment of the rectifier circuit enables settings of higher or lower amplitudes during each active pulse of the pulsing pattern.

6. The plasma processing system of claim 5, wherein the active pulse is one of a positive pulse of the amplified DC voltage signal and a negative pulse of the amplified DC voltage signal.

7. The plasma processing system of claim 3, wherein the resonant circuit is defined from resistive values, inductive values, and capacitive values, which define a quality factor Q, the quality factor Q providing an amplification for the amplified DC voltage signal.

8. The plasma processing system of claim 3, wherein the rectifier circuit defines at least part of a diode bridge.

9. The plasma processing system of claim 8, wherein circuits of the diode bridge being adjustable in response to a ripple control signal, the ripple control signal acting to adjust an amplitude of the frequency component during a positive pulse of the pulsing pattern.

10. The plasma processing system of claim 2, wherein the DC voltage supply and RF generator include field effect transistors (FETs) that are driven by a gate driver and supplied the DC voltage input.

11. The plasma processing system of claim 1, wherein the RF component is supplied to a positive pulse of the amplified DC voltage signal or a negative pulse of the amplified DC voltage signal, and wherein no RF component is supplied during an off pulse of the amplified DC voltage signal.

12. The plasma processing system of claim 1, wherein the controller is coupled to a power control that provides the pulsing pattern, wherein the pulse pattern is digitally programmable to set one or more of voltage amplitude of the DC voltage input, a polarity of the DC voltage input, a rise and decay time of the DC voltage input, a width and delay of the DC voltage input, or combination of two or more thereof.

13. The plasma processing system of claim 1, wherein a process recipe is configured to set a programming for the pulse pattern, the programming being applied by the controller by digital programming to the DC to DC converter.

14. The plasma processing system of claim 13, wherein the programming for the pulse pattern defines a frequency of the DC voltage input and a frequency of the RF component.

15. The plasma processing system of claim 14, wherein the frequency of the DC voltage input is less than about 1 MHz, and the frequency of the RF component is selected from one of 2 MHz, 13.56 MHz, 27 MHz, 60 MHz, and 80 MHz.

16. The plasma processing system of claim 14, wherein the frequency of the DC voltage input is 400 KHz or less and the frequency of the RF component is selected from one of 2 MHz, 13.56 MHz, 27 MHz, 60 MHz, and 80 MHz, wherein the chamber is configured for producing a capacitively coupled plasma (CCP) source between the lower electrode and the upper electrode, the CCP source being used for etching a material from a substrate when disposed on the substrate support of the chamber.

17. The plasma processing system of claim 16, wherein the DC to DC converter is one of a plurality of DC to DC converters connected to the lower electrode, wherein each of the plurality of DC to DC converters is configured to produce an amount of power and the plurality of DC to DC converters are combined to produce a sum of the amount of power from the plurality of DC to DC converters.

18. The plasma processing system of claim 16, wherein the pulsing pattern is selected from one of (i) an alternating positive and negative pulse, (ii) a positive pulse, an off period, and a negative pulse, (iii), a positive pulse, an off period, and a negative pulse, wherein a magnitude of the positive pulse and the negative pulse vary, (iv) a positive pulse, an off period, and a positive pulse, (v) a positive pulse, an adjustable off period, and another positive pulse and then repeat, (vi), a varying width positive or negative pulse that repeats, (vii), a positive predefined pulse width with a predefined pulse amplitude, followed by an off period, and then a repeat of the positive predefined pulse width with the predefined pulse amplitude; (viii) a negative predefined pulse width with a predefined pulse amplitude, followed by an off period, and then a repeat of the negative predefined pulse width with the predefined pulse amplitude; and (ix) a positive pulse having a predefined amplitude and width, followed by an off period or a negative pulse having a predefined amplitude and width, or (x) a combination of two or more thereof.

19. A plasma processing system, comprising,
a chamber having a lower electrode coupled to a substrate support and an upper electrode coupled to ground, a plasma processing volume is defined between the upper electrode and the lower electrode;
a first direct current (DC) to direct current (DC) converter configured to receive at an input a positive DC voltage input and supply at an output a positive amplified DC voltage signal that includes a radio frequency (RF) component, the positive DC voltage input follows a pulsing pattern that is digitally programmable, the output of the DC to DC convertor is connected to the lower electrode of the chamber;
a second direct current (DC) to direct current (DC) converter configured to receive at an input a negative DC voltage input and supply at an output a negative amplified DC voltage signal that includes a radio frequency (RF) component, the negative DC voltage input follows a pulsing pattern that is digitally programmable, the output of the DC to DC converter is connected to the lower electrode of the chamber;
a controller being interfaced with the first and second DC to DC converters to set the pulsing pattern, wherein positive pulses of the pulsing pattern are provided by the first DC to DC converter and negative pulses of the pulsing pattern are provided by the second DC to DC converter.

20. The plasma processing system of claim 19, wherein each of the first and second DC to DC converters includes,
a DC voltage supply, and
a RF generator that is driven by the DC voltage supply, the RF generator producing a frequency of the RF component;
a resonant circuit that is configured to multiply the positive or negative DC input voltages; and
a rectifier circuit that receives the multiplied positive or negative DC input voltages and the RF component to produce the amplified positive or negative DC voltage signals that includes the RF component.

21. The plasma processing system of claim 20, further comprising,
a ripple control being interfaced with the controller, the ripple control configured to dynamically adjust the rectifier circuit of the first DC to DC converter to modify an amplitude of the frequency component.

22. The plasma processing system of claim 21, wherein the dynamic adjustment of the rectifier circuit enables settings of higher or lower amplitudes during each active pulse of the pulsing pattern.

23. The plasma processing system of claim 19, wherein the frequency of the positive and negative DC voltage input is 400 KHz or less and the frequency of the RF component is selected from one of 2 MHz, 13.56 MHz, 27 MHz, 60 MHz, and 80 MHz, wherein the chamber is configured for producing a capacitively coupled plasma (CCP) source between the lower electrode and the upper electrode, the CCP source being used for etching a material from a substrate when disposed on the substrate support of the chamber.

24. The plasma processing system of claim 19, wherein the pulsing pattern is selected from one of (i) an alternating positive and negative pulse, (ii) a positive pulse, an off period, and a negative pulse, (iii), a positive pulse, an off period, and a negative pulse, wherein a magnitude of the positive pulse and the negative pulse vary, (iv) a positive pulse, an off period, and a positive pulse, (v) a positive pulse, an adjustable off period, and another positive pulse and then repeat, (vi), a varying width positive or negative pulse that repeats, (vii), a positive predefined pulse width with a predefined pulse amplitude, followed by an off period, and then a repeat of the positive predefined pulse width with the predefined pulse amplitude; (viii) a negative predefined pulse width with a predefined pulse amplitude, followed by an off period, and then a repeat of the negative predefined pulse width with the predefined pulse amplitude; or (ix) a positive pulse having a predefined amplitude and width, followed by an off period or a negative pulse having a predefined amplitude and width, and (x) a combination of two or more thereof.

25. A method for processing a substrate using a capacitively coupled plasma (CCP) chamber driven by a DC to DC converter, comprising,
providing the chamber having a lower electrode coupled to a substrate support and an upper electrode coupled to ground, a plasma processing volume is defined between the upper electrode and the lower electrode;
providing a direct current (DC) voltage input based on a pulsing pattern, the pulsing pattern being defined by a digital program;
generating a radio frequency (RF) component using the DC input voltage;
amplifying the DC input voltage that includes the RF component; and
rectifying the RF component to produce an amplified DC voltage signal that includes the RF component, the amplified DC voltage signal that includes the RF component being supplied to the lower electrode of the chamber;
wherein the pulsing pattern that is defined by the digital program defines a frequency of the amplified DC voltage signal and a frequency of the RF component, the frequency of the amplified DC voltage defines positive or negative pulses, and pulse widths and amplitudes of the positive or negative pulses.

26. The method of claim 25, wherein the frequency of the DC voltage input is 400 KHz or less and the frequency of the RF component is selected from one of 2 MHz, 13.56 MHz, 27 MHz, 60 MHz, and 80 MHz, the CCP chamber used for etching a material from a substrate when disposed on the substrate support of the chamber.

27. The method of claim 25, further comprising,
providing a ripple control to dynamically adjust an amplitude of the RF component during a positive pulse of the pulsing pattern.

28. The method of claim 27, wherein the dynamic adjustment of the amplitude occurs during one or more phases of the positive pulse of the pulsing pattern.

29. The method of claim 25, wherein digital program that defines the pulse pattern set one or more of voltage amplitude of the DC voltage input, a polarity of the DC voltage input, a rise and decay time of the DC voltage input, a width and delay of the DC voltage input, or combination of two or more thereof.

30. The method of claim 29, wherein the pulsing pattern is selected from one of (i) an alternating positive and negative pulse, (ii) a positive pulse, an off period, and a negative pulse, (iii), a positive pulse, an off period, and a negative pulse, wherein a magnitude of the positive pulse and the negative pulse vary, (iv) a positive pulse, an off period, and a positive pulse, (v) a positive pulse, an adjustable off period, and another positive pulse and then repeat, (vi), a varying width positive or negative pulse that repeats, (vii), a positive predefined pulse width with a predefined pulse amplitude, followed by an off period, and then a repeat of the positive predefined pulse width with the predefined pulse amplitude; (viii) a negative predefined pulse width with a predefined pulse amplitude, followed by an off period, and then a repeat of the negative predefined pulse width with the predefined pulse amplitude; or (ix) a positive pulse having a predefined amplitude and width, followed by an off period or a negative pulse having a predefined amplitude and width, and (x) a combination of two or more thereof.

* * * * *